US012044956B2

(12) United States Patent
Motobayashi et al.

(10) Patent No.: US 12,044,956 B2
(45) Date of Patent: Jul. 23, 2024

(54) LIGHT-EMITTING DEVICE AND PROJECTION DISPLAY APPARATUS

(71) Applicant: Sony Corporation, Tokyo (JP)

(72) Inventors: Hisayoshi Motobayashi, Tokyo (JP);
Hidekazu Kawanishi, Tokyo (JP);
Yoshiro Takiguchi, Tokyo (JP);
Masahiro Murayama, Tokyo (JP);
Hiroyuki Miyahara, Tokyo (JP);
Hitoshi Domon, Tokyo (JP)

(73) Assignee: Sony Corporation, Tokyo (JP)

( * ) Notice: Subject to any disclaimer, the term of this patent is extended or adjusted under 35 U.S.C. 154(b) by 570 days.

(21) Appl. No.: 17/268,288

(22) PCT Filed: Jul. 26, 2019

(86) PCT No.: PCT/JP2019/029400
§ 371 (c)(1),
(2) Date: Feb. 12, 2021

(87) PCT Pub. No.: WO2020/036053
PCT Pub. Date: Feb. 20, 2020

(65) Prior Publication Data
US 2021/0181614 A1    Jun. 17, 2021

(30) Foreign Application Priority Data
Aug. 15, 2018   (JP) .................. 2018-152939

(51) Int. Cl.
*G03B 21/20* (2006.01)
*H01S 5/02218* (2021.01)
(Continued)

(52) U.S. Cl.
CPC ....... *G03B 21/2033* (2013.01); *G03B 21/208* (2013.01); *H01S 5/02218* (2021.01);
(Continued)

(58) Field of Classification Search
USPC ........................................ 353/101
See application file for complete search history.

(56) References Cited

U.S. PATENT DOCUMENTS 10,267,483 B2 * 4/2019 Kiyota ............... H01S 5/02253
2006/0001030 A1 * 1/2006 Okuwaki ........... H01L 25/0753
257/431
(Continued)

FOREIGN PATENT DOCUMENTS

JP     2011243642 A    12/2011
JP     2013254889 A    12/2013
(Continued)

OTHER PUBLICATIONS

International Search Report mailed Oct. 21, 2019 in connection with PCT/JP2019/029400.

*Primary Examiner* — Jerry L Brooks
(74) *Attorney, Agent, or Firm* — K&L Gates LLP

(57) ABSTRACT

A light-emitting device including: a package including a light-emitting element, a reflection member that reflects light outputted from the light-emitting element, and a sealed space that accommodates the light-emitting element and the reflection member; a base plate on which a plurality of the packages is mounted; and lenses opposed to the base plate with the plurality of packages interposed therebetween, the lenses being opposed to the respective packages.

19 Claims, 8 Drawing Sheets

(51) Int. Cl.
   *H01S 5/02255*   (2021.01)
   *H01S 5/02257*   (2021.01)
   *H01S 5/02315*   (2021.01)
   *H01S 5/02325*   (2021.01)
   *H01S 5/0239*    (2021.01)
   *H01S 5/024*     (2006.01)
   *H01S 5/323*     (2006.01)
   *H01S 5/40*      (2006.01)

(52) U.S. Cl.
   CPC ...... *H01S 5/02255* (2021.01); *H01S 5/02257* (2021.01); *H01S 5/02315* (2021.01); *H01S 5/02325* (2021.01); *H01S 5/0239* (2021.01); *H01S 5/02469* (2013.01); *H01S 5/32341* (2013.01); *H01S 5/4031* (2013.01); *H01S 5/4087* (2013.01)

(56) References Cited

U.S. PATENT DOCUMENTS

| | | |
|---|---|---|
| 2011/0280270 A1 | 11/2011 | Hayashi |
| 2013/0003937 A1 | 1/2013 | Miller |
| 2013/0039374 A1 | 2/2013 | Lutgen et al. |
| 2013/0329397 A1 | 12/2013 | Shimizu et al. |
| 2016/0341395 A1 | 11/2016 | Kiyota et al. |
| 2017/0122505 A1 | 5/2017 | Kiyota et al. |
| 2017/0336703 A1 | 11/2017 | Takagi |
| 2018/0287336 A1 | 10/2018 | Victoria |

FOREIGN PATENT DOCUMENTS

| | | | |
|---|---|---|---|
| JP | 2015228401 A | 12/2015 | |
| JP | 2016219779 A | 12/2016 | |
| JP | 2017085036 A | 5/2017 | |
| JP | 2017207732 A | 11/2017 | |
| JP | 2018006477 A | 1/2018 | |
| JP | 2018512745 A | 5/2018 | |

* cited by examiner

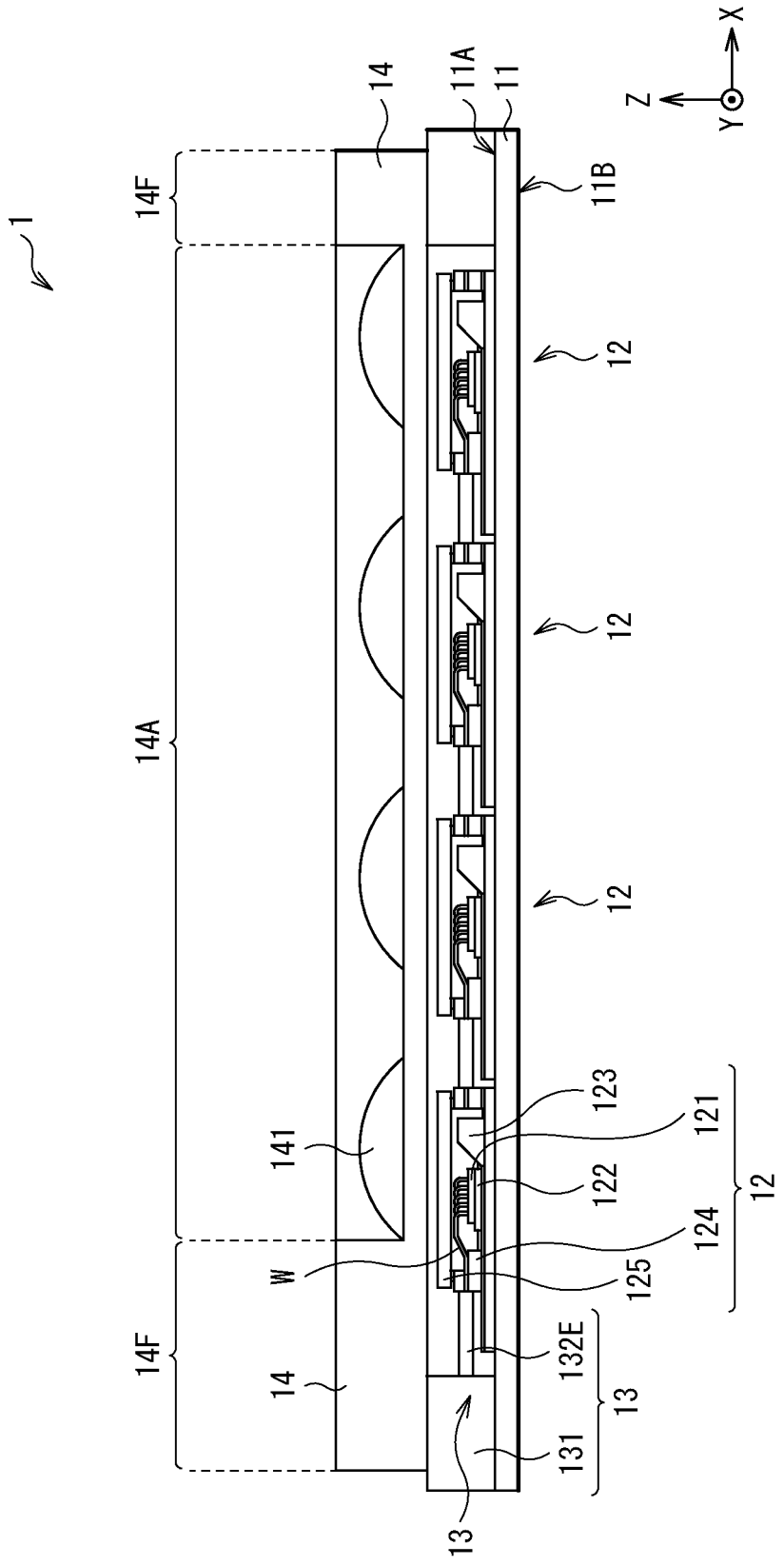
[ FIG. 1 ]

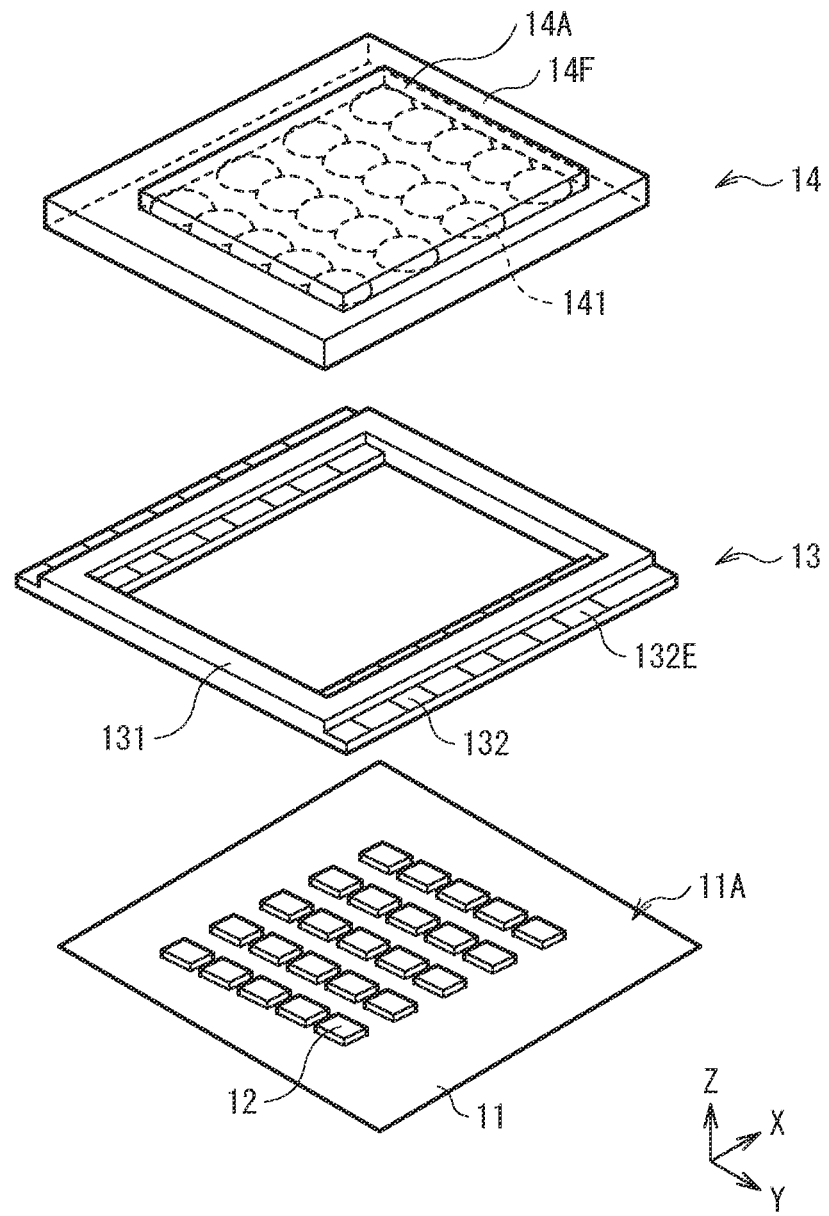
[FIG. 2]

[FIG. 3]
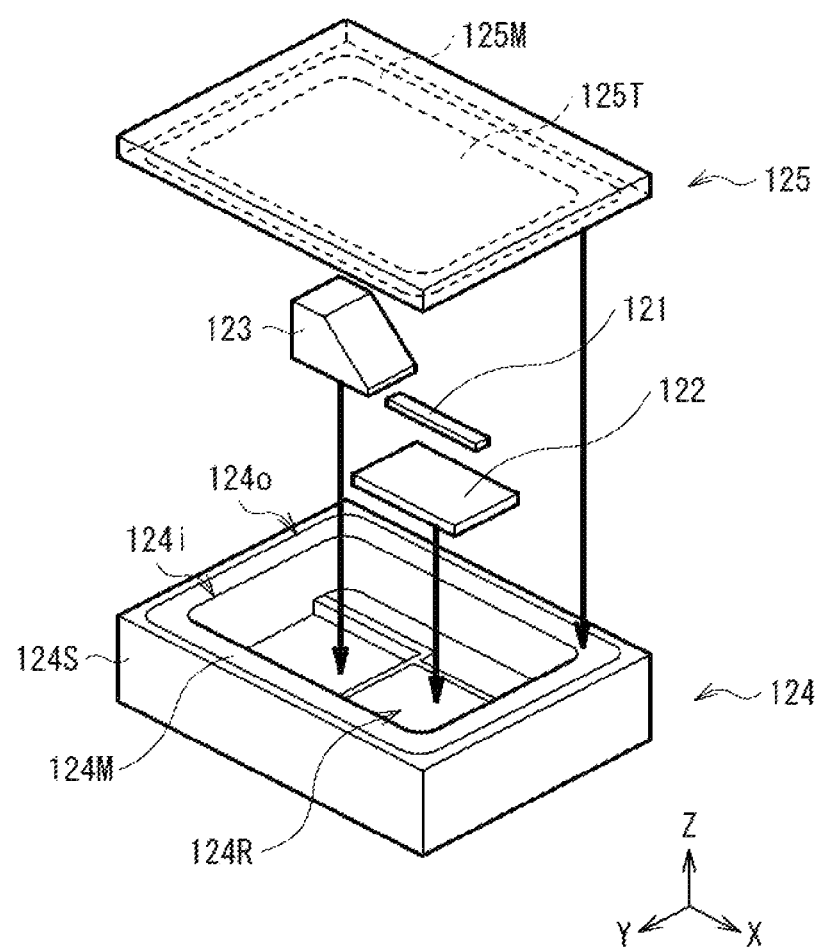

[ FIG. 4 ]
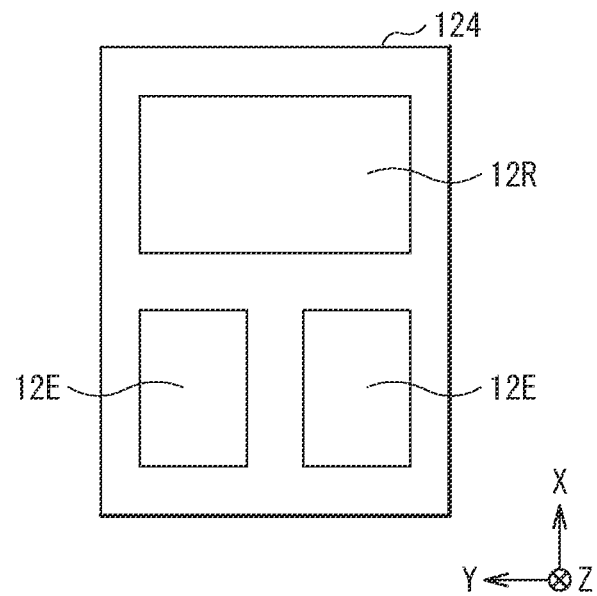
[ FIG. 5 ]
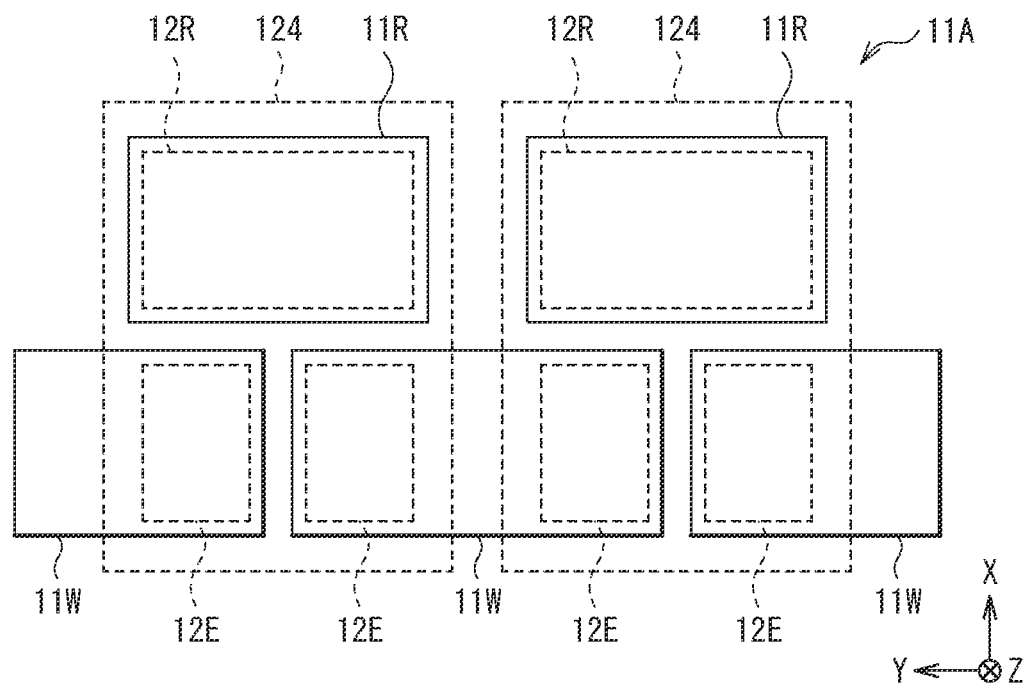

[ FIG. 6 ]
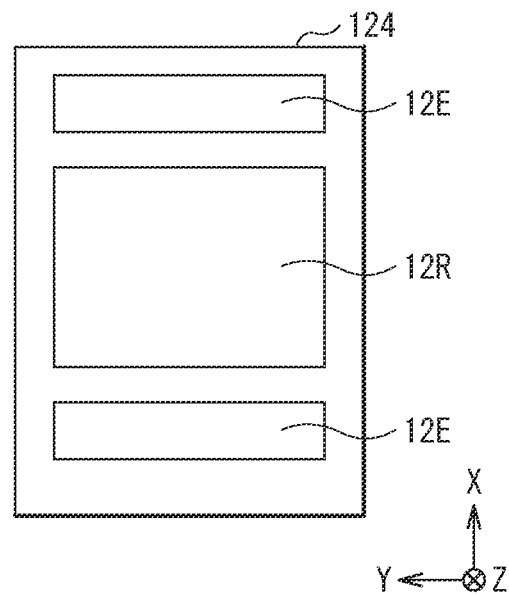
[ FIG. 7 ]
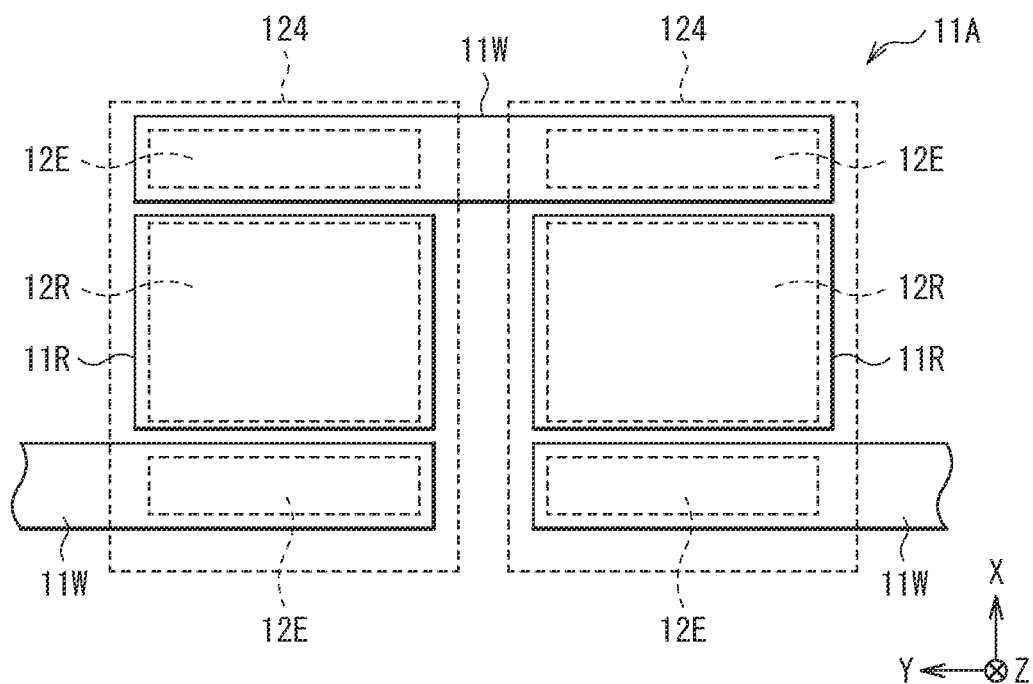

[FIG. 8]
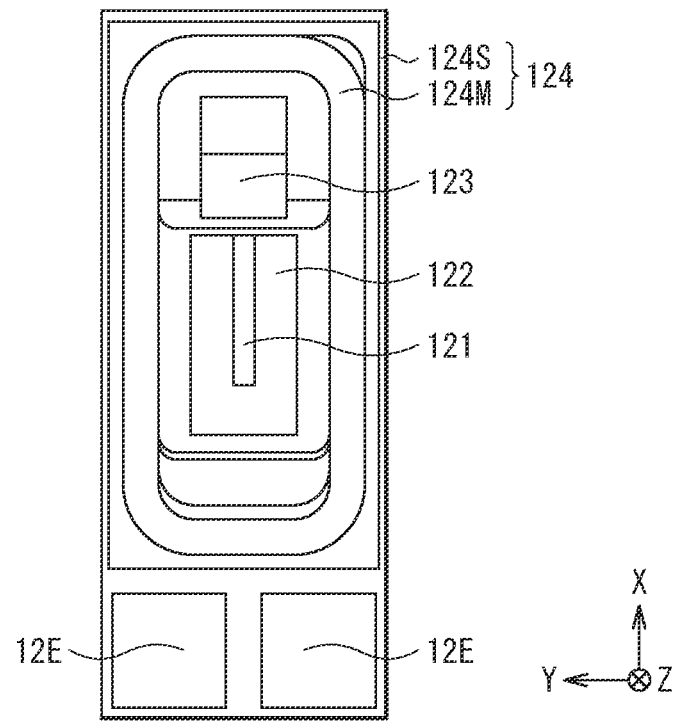
[FIG. 9]
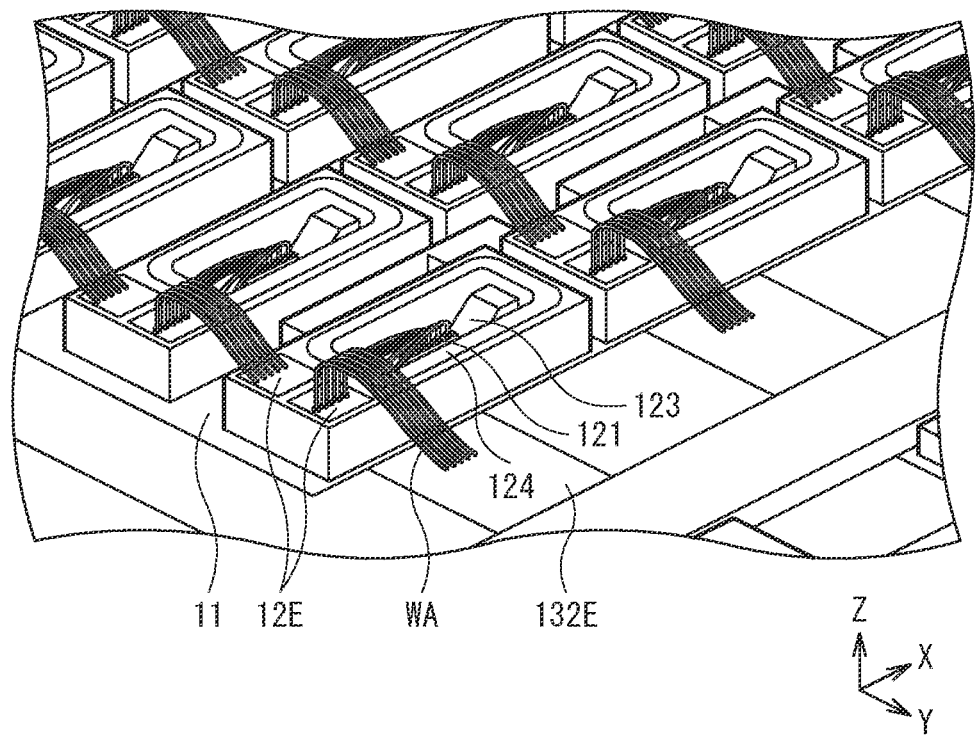

[FIG. 10]
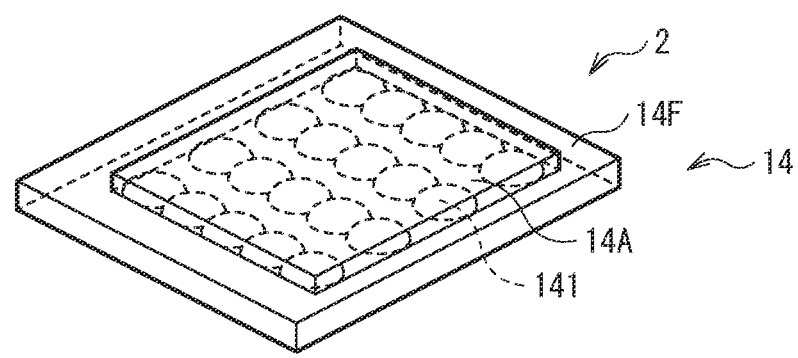
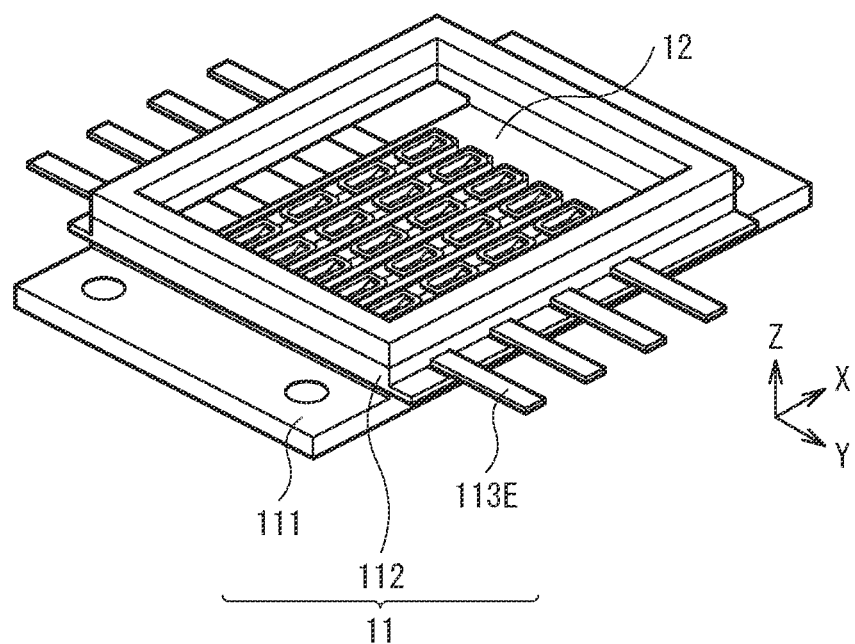

[FIG. 11]
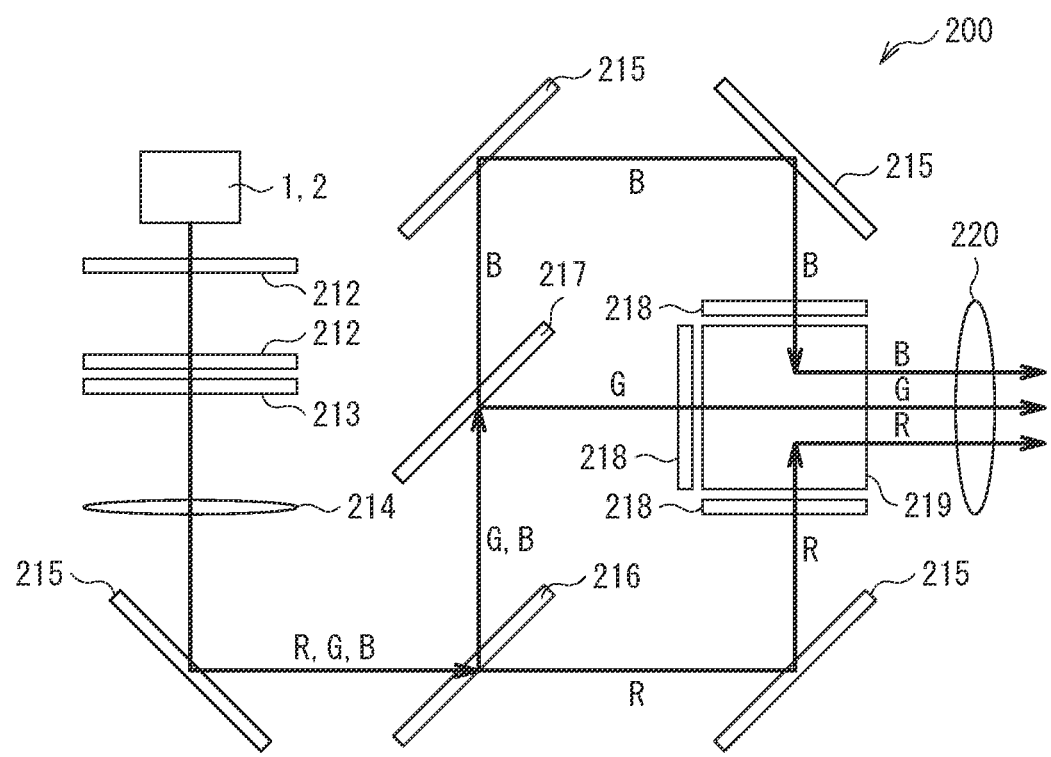

LIGHT-EMITTING DEVICE AND PROJECTION DISPLAY APPARATUS

TECHNICAL FIELD

The present technology relates to: a light-emitting device including a light-emitting element such as a semiconductor laser element, for example; and a projection display apparatus including the light-emitting device.

BACKGROUND ART

For example, a light-emitting device including a plurality of light-emitting elements such as semiconductor laser elements has been developed (see PTL 1, for example). The plurality of semiconductor laser elements is hermetically sealed collectively, for example.

CITATION LIST

Patent Literature

PTL 1: Japanese Unexamined Patent Application Publication No. 2017-208484

SUMMARY OF THE INVENTION

In such a light-emitting device, it is desired to suppress flow of gas (hereinafter, referred to as leakage) from a hermetically sealed space to the outside.

Therefore, it is desirable to provide a light-emitting device that is able to suppress occurrence of leakage and a projection display apparatus including the light-emitting device.

A light-emitting device according to an embodiment of the present technology includes: a package including a light-emitting element, a reflection member that reflects light outputted from the light-emitting element, and a sealed space that accommodates the light-emitting element and the reflection member; a base plate on which a plurality of the packages is mounted; and lenses opposed to the base plate with the plurality of packages interposed therebetween, the lenses being opposed to the respective packages.

A projection display apparatus according to an embodiment of the present technology includes the light-emitting device according to an embodiment of the present technology.

The light-emitting device and the projection display apparatus according to one embodiment of the present technology is provided with light-emitting elements for the respective plurality of packages. In other words, each light-emitting element is accommodated in a sealed space.

According to the light-emitting device and the projection display apparatus of an embodiment of the present technology, each light-emitting element is accommodated in the sealed space, which makes it possible to suppress the occurrence of leakage as compared with the case where the plurality of light-emitting elements is sealed collectively. Therefore, it is possible to suppress the occurrence of leakage.

It is to be noted that the above is an example of the present disclosure. The effect of the present disclosure is not limited to those described above, and may include other different effects or may further include other effects.

BRIEF DESCRIPTION OF DRAWINGS

FIG. 1 is a side schematic view of a schematic configuration of a light-emitting device according to a first embodiment of the present technology.

FIG. 2 is an exploded perspective view of a schematic configuration of the light-emitting device illustrated in FIG. 1.

FIG. 3 is an exploded perspective view of a specific configuration of a package illustrated in FIG. 1 and the like.

FIG. 4 is a plan schematic view of an exemplary configuration of a back surface of the package illustrated in FIG. 1 and the like.

FIG. 5 is a plan schematic view of a configuration of a front surface of a base plate together with the package illustrated in FIG. 4.

FIG. 6 is a plan schematic view of another exemplary configuration of the back surface of the package illustrated in FIG. 1 and the like.

FIG. 7 is a plan schematic view of a configuration of the front surface of the base plate together with the package illustrated in FIG. 6.

FIG. 8 is a plan schematic view of a configuration of a top surface of a package according to a modification example 2.

FIG. 9 is a perspective view for explaining a connection between the package illustrated in FIG. 8 and a terminal of a lens holding member.

FIG. 10 is an exploded perspective view of a schematic configuration of a light-emitting device according to a second embodiment of the present technology.

FIG. 11 is a diagram illustrating an exemplary configuration of a projection display apparatus to which the light-emitting device illustrated in FIG. 1 or the like is applied.

MODES FOR CARRYING OUT THE INVENTION

In the following, some embodiments of the present disclosure are described in detail with reference to the drawings. It is to be noted that description is given in the following order.

1. First Embodiment (an example of a light-emitting device in which a light-emitting element is sealed in each of a plurality of packages)
2. Modification Example 1 (an example including light-emitting elements that output light beams having different wavelengths)
3. Modification Example 2 (an example including an electrode extraction part on a front surface side of a package)
4. Second Embodiment (an example of a light-emitting device including a base plate provided with a holding part)
5. Application Example (an example of a projection display apparatus)

First Embodiment

<Structure of Light-Emitting Device 1>

FIG. 1 illustrates a schematic side configuration of a light-emitting device (a light-emitting device 1) according to an embodiment of the present technology, and FIG. 2 is an exploded perspective view of the light-emitting device 1 illustrated in FIG. 1. The light-emitting device 1 includes a base plate 11, a package 12, a lens holding member 13, and a lens array 14. The package 12 is provided with a light-emitting element 121 and the like. The lens array 14 includes a lens 141 corresponding to each package 12.

(Base Plate 11)

The base plate 11 is a member for mounting the package 12. The base plate 11 is, for example, a flat plate-shaped member, and has a front surface 11A and a back surface 11B opposed to each other. The front surface 11A is provided with a plurality of packages 12, and the back surface 11B is thermally coupled to, for example, a heat sink or the like (not illustrated). The front surface 11A of the base plate 11 is provided with a wiring line (a wiring line 11W in FIGS. 5 and 7 to be described later) electrically coupled to the light-emitting element 121.

The base plate 11 includes, for example, a ceramic material, a metal material, or the like. The base plate 11 including a metal material is able to enhance heat dissipation. Examples of the metal material include iron (Fe), an iron alloy, copper (Cu), and a copper alloy, and the like. Examples of the copper alloy include copper-tungsten (CuW) and the like. Examples of the ceramic material include aluminum nitride (AlN) and the like. The base plate 11 may be provided with a coolant channel.

The base plate 11 may be provided with a recess for mounting the package 12. Providing the package 12 in the recess of the base plate 11 makes it possible to protect the package 12.

(Package 12)

A plurality of packages 12 are mounted on the front surface 11A of the base plate 11. The plurality of packages 12 is, for example, arranged in a matrix on the front surface 11A of the base plate 11 (in an X direction and a Y direction of FIG. 2). For example, some of the packages 12 arranged in a matrix may be removed. The omission of some of the packages 12 is, for example, for a purpose of removing defective products or a purpose of reducing a part of a power density in the surface. The package 12 may be arranged in other forms, for example, a substantially hexagonal shape, a houndstooth shape, and the like. Each of the plurality of packages 12 has a light-emitting element 121, a submount 122, a mirror 123 (a reflection member), an accommodation member 124 (a first accommodation member), and a cover 125 (a second accommodation member) (FIG. 1).

According to the present embodiment, in this way, the plurality of packages 12 is provided on the front surface 11A of the base plate 11, and the light-emitting element 121 is sealed in each package 12. As will be described later in detail, this makes it possible to suppress the occurrence of leakage as compared with the case where the plurality of light-emitting elements 121 is sealed collectively.

FIG. 3 is an exploded perspective view of a specific configuration of the package 12. In a central portion of the accommodation member 124, a recess 124R is provided, in which the light-emitting element 121, the submount 122, and the mirror 123 are accommodated. The cover 125 covers the recess 124R. In other words, the accommodation member 124 and the cover 125 are provided in this order from a base plate 11 side.

One light-emitting element 121 is provided for each package 12, for example. The light-emitting element 121 includes, for example, a semiconductor laser element such as an LD (Laser Diode). The light-emitting element 121 includes, for example, a gallium nitride (GaN)-based semiconductor material and outputs light in the blue wavelength range. A wavelength-conversion member such as a fluorescent material may be disposed in an optical path of the light outputted from the light-emitting element 121. The light-emitting element 121 may include, for example, a semiconductor material such as a gallium arsenide (GaAs)-based material or the like. An anode and a cathode of the light-emitting element 121 are coupled to an electrode coupling part of the accommodation member 124 by wire bonding using wires W, for example. The wires W include, for example, gold (Au).

The submount 122 is for mounting the light-emitting element 121 and is provided between the light-emitting element 121 and a bottom surface of the accommodation member 124 (more specifically, a bottom surface of the recess 124R). The submount 122 is, for example, a plate-shape member, and a position of the light-emitting element 121 may be adjusted using a thickness of the submount 122 (a size in a Z-direction in FIG. 3). The submount 122 includes, for example, an insulating material such as aluminum nitride (AlN), silicon (Si), silicon carbide (SiC), diamond, beryllium oxide (BeO), or the like.

The submount 122 may include, for example, a conductive material such as copper tungsten (Cu—W), copper molybdenum (Cu—Mo), copper diamond, graphite, or the like. Using the conductive submount 122 makes it possible to cause one of the electrodes of the light-emitting element 121 to be electrically conducted to an electrode inside the accommodation member 124 through the submount 122. As a result, for example, the number of wires W coupled to the light-emitting element 121 is reduced, which makes it possible to reduce a size of the package 12. With reduction in the size of the package 12, it becomes possible to lower the cost. Further, it becomes possible to more densely mount the packages 12 on the front surface 11A of the base plate 11. Still further, as will be described in detail later, the reduction in the size of the package 12 reduces an area of a bonding region between the accommodation member 124 and the cover 125, and makes it possible to suppress the occurrence of the leakage and a crack in the accommodation member 124 due to concentration of stress in the bonding region.

The light-emitting element 121 is eutectically bonded to the submount 122 by AuSn (gold-tin), for example, and the submount 122 is eutectically bonded to the bottom surface of the accommodation member 124 by AuSn, for example. The submount 122 may be bonded to the bottom surface of the accommodation member 124 by, for example, silver (Ag) paste, sintered gold (Au), sintered silver (Ag), or the like.

The mirror 123 reflects the light outputted from the light-emitting element 121. The light outputted from the light-emitting element 121 is reflected by the mirror 123, and the light is outputted from a cover 125 side. The mirror 123 is provided on the recess 124R of the accommodation member 124 together with the light-emitting element 121 mounted on the submount 122. For example, a step is provided in the recess 124R, and the mirror 123 is disposed at a position lower than a position of the light-emitting element 121 (a position closer to the bottom surface of the recess 124R) (FIG. 1). The inside of the recess 124R may have a flat surface, and the mirror 123 and the light-emitting element 121 mounted on the submount 122 may be disposed on the same surface.

The mirror 123 has, for example, an inclined surface, and the inclined surface is disposed so as to be opposed to a light-emitting surface of the light-emitting element 121. The inclined surface of the mirror 123 is inclined, for example, by 45° with respect to the bottom surface of the accommodation member 124. This makes it possible to extract the light reflected by the inclined surface of the mirror 123 perpendicularly to the bottom surface of the accommodation member 124. By adjusting the angle of the inclined surface of the mirror 123, it is also possible to change a light extraction direction. The mirror 123 includes, for example, glass, synthetic quartz, silicon, sapphire, aluminum, or the like. The inclined surface of the mirror 123 may be provided with, for example, a reflective film such as a metallic film, a dielectric multilayer film, or the like. The reflective film has, for example, a reflectance of 90% or more with respect to the light outputted from the light-emitting element 121. It is preferable that the reflective film have a reflectance of 99% or more.

The accommodation member 124 having the recess 124R is bonded to the cover 125, and together with the cover 125 seals the light-emitting element 121 mounted on the submount 122 and the mirror 123. That is, the recess 124R and the cover 125 constitute a sealed space. The recess 124R has, for example, a rectangular planar shape. The accommodation member 124 includes, for example, a ceramic portion 124S and a metal portion 124M. The ceramic portion 124S is for forming a three-dimensional form of the accommodation member 124, and is included in the majority of the accommodation member 124. The ceramic portion 124S includes, for example, a sintered body such as aluminum nitride (AlN), aluminum oxide (alumina), silicon carbide (SiC), or the like.

The metal portion 124M is disposed, for example, on the bottom surface of the recess 124R and on a top surface of an outer side of the recess 124R (a bonding surface with the cover 125). Such a metal portion 124M include, for example, gold (Au) or the like. The provision of the metal portion 124M on the bottom surface of the recess 124R makes it possible to efficiently radiate heat and also to facilitate solder bonding with the submount 122. The metal portion 124M of the bottom surface of the recess 124R is insulated, for example, from an electrode extraction part 12E to be described later (FIG. 4, etc., to be described later). The metal portion 124M provided on the top surface of the outer side of the recess 124R is a portion to be bonded to the cover 125 and surrounds the recess 124R in a frame shape. The metal portion 124M and the cover 125 (specifically, a metal portion 125M to be described later), for example, are bonded using a solder such as SnAgCu (tin-silver-copper). The solder may be an AuSn (gold-tin)-based solder, a Sn (tin)-based solder, an In (indium)-based solder, or the like.

In order to suppress a defect caused by excessive soldering, it is preferable that the metal portion 124M on the outer side of the recess 124R is disposed on an inner side of a frame portion surrounding the recess 124R. Specifically, the frame portion surrounding the recess 124R is a portion between an inner edge 124i forming a peripheral edge of the recess 124R and an outer edge 124o forming an outer shape of the accommodation member 124. It is desirable that the metal portion 124M of the outer side of the recess 124R be not in contact with at least one of the inner edge 124i or the outer edge 124o.

By using such soldering or the like, it is preferable that the light-emitting element 121 or the like is hermetically sealed between the accommodation member 124 and the cover 125. The reason therefor will be described below.

Driving of the light-emitting element 121 including the semiconductor laser element causes siloxane in the atmosphere to react with light in the vicinity of a light-emitting point, and a reactant tends to be deposited on an end surface of the light-emitting element 121. This reactant causes a change in a reflectance of the end surface, which may cause a decrease in an optical characteristic and destruction of the light-emitting element 121. When the wavelength of the light outputted from the light-emitting element 121 is, for example, a short wavelength of 500 nm or less, particularly 460 nm or less, a defect caused by the siloxane in the atmosphere is apt to occur. The hermetic sealing of the light-emitting element 121 or the like between the accommodation member 124 and the cover 125 makes it possible to suppress the occurrence of the defect caused by the siloxane in the atmosphere.

A top surface side of the accommodation member 124 is covered with the cover 125, and a lower surface side of the accommodation member 124 is held on the front surface 11A of the base plate 11 by, for example, silver (Ag) paste or the like.

FIG. 4 illustrates an exemplary planar configuration of a bonding surface of the accommodation member 124 with the base plate 11 (hereinafter referred to as back surface of the accommodation member 124). The back surface of the accommodation member 124 is provided with, for example, two electrode extraction parts 12E and a heat radiation part 12R. The two electrode extraction parts 12E are where the electrodes are drawn from the anode and the cathode of the light-emitting element 121. The accommodation member 124 is provided with a via, for example, such that the anode and the cathode of the light-emitting element 121 are drawn through the wires W and the via to the back surface of the accommodation member 124. The heat radiation part 12R is disposed at a position different from the positions of the electrode extraction parts 12E, and is a portion for radiating heat generated in the light-emitting element 121 to the base plate 11. It is preferable that the heat radiation part 12R be disposed at a position overlapping with the light-emitting element 121, i.e., immediately below the light-emitting element 121, when viewed in a plane (e.g., an XY plane in FIG. 3). As described above, the provision of the electrode extraction parts 12E and the heat radiation part 12R on the back surface of the accommodation member 124 makes it possible to be electrically coupled and thermally coupled to each package 12. For example, the heat radiation part 12R is provided on one portion in a long-side direction (the X direction in FIG. 4) of the substantially rectangular parallelepiped accommodation member 124, and the electrode extraction parts 12E are provided on the other portion in the long-side direction thereof. The two electrode extraction parts 12E are disposed side by side in, for example, the short-side direction (the Y direction in FIG. 4) of the accommodation member 124.

FIG. 5 illustrates an exemplary connection state between the electrode extraction parts 12E and the heat radiation part 12R included in the accommodation member 124 and the base plate 11 (the front surface 11A). The front surface 11A of the base plate 11 is provided with, for example, a plurality of wiring lines 11W, and the electrode extraction part 12E is bonded to the wiring line 11W through silver (Ag) paste. This causes the anode and the cathode of the light-emitting element 121 to be electrically coupled to the wiring line 11W, and a current flows through the light-emitting element 121. On the front surface 11A of the base plate 11, a heat radiation part 11R is provided for each package 12. The heat radiation part 11R is a portion bonded to the heat radiation part 12R of the accommodation member 124 through the silver (Ag) paste. Heat radiation parts 12R of packages 12 that are adjacent to each other (or the heat radiation part 11R of the base plate 11) may be continuous through the silver paste. For example, as will be described later, by disposing all packages 12 on the front surface 11A of the base plate 11 and then curing collectively the packages 12, the heat radiation parts 12R of the packages 12 that are adjacent to each other are continuously formed through the silver paste. Thus, by thermally coupling the heat radiation parts 12R of the packages 12 that are adjacent to each other, the heat dissipation path is spread, and it is possible to improve a heat dissipation property. Here, the silver paste corresponds to a specific example of a heat conductive member according to the present technology.

FIG. 6 illustrates another exemplary planar configuration of the back surface of the accommodation member 124, and FIG. 7 illustrates an exemplary connection state between the electrode extraction parts 12E and the heat radiation part 12R illustrated in FIG. 6 and the base plate 11 (the front surface 11A). In this manner, the electrode extraction part 12E, the heat radiation part 12R, and the electrode extraction part 12E may be disposed in this order along the long-side direction (the X direction in FIG. 6) of the substantially rectangular parallelepiped accommodation member 124. Although FIG. 5 and FIG. 7 each illustrate an example in which the plurality of packages 12 is coupled in series through the wiring lines 11W, for example, the plurality of packages 12 may be coupled in parallel via the wiring lines 11W. The arrangement of the electrode extraction parts 12E and the heat radiation part 12R is not limited to the examples illustrated in FIG. 4 and FIG. 6.

In the cover 125 bonded to the accommodation member 124, the light outputted from the light-emitting element 121 is extracted. The cover 125 is, for example, a plate-shape member having a rectangular planar shape, and covers at least the recess 124R of the accommodation member 124. The cover 125 includes: the metal portion 125M soldered to the metal portion 124M of the accommodation member 124; and a translucent portion 125T. The metal portion 125M is provided on a lower surface (a surface opposing the accommodation member 124). The metal portion 125M has substantially the same planar shape as the planar shape of the metal portion 124M of the accommodation member 124. Specifically, the metal portion 125M has a frame shape surrounding the recess 124R, and a width of the metal portion 125M is substantially the same as the width of the metal portion 124M. The metal portion 125M contains, for example, gold (A) or the like. At least a portion of the cover 125 covering the recess 124R includes the translucent portion 125T. For example, the majority of the cover 125 includes the translucent portion 125T. The translucent portion 125T includes a material having a high transmittance with respect to light of wavelengths outputted from the light-emitting element 121. The translucent portion 125T includes, for example, glass or the like.

Intervals of the plurality of packages 12 arranged in a matrix on the front surface 11A of the base plate 11 are smaller in a θ-parallel direction than in a θ-perpendicular direction, for example. Since an FFP (Far Field Pattern) half-value width in the θ-parallel direction is narrower than an FFP half-value width in the θ-perpendicular direction, it is possible to reduce the intervals of the packages 12 in the θ-parallel direction. This makes it possible to increase a light density. The plurality of packages 12 may be arranged in a line.

(Lens Holding Member 13)

The lens holding member 13 provided between the base plate 11 and the lens array 14 has, for example, a frame shape surrounding the plurality of packages 12 mounted on the front surface 11A of the base plate 11 (FIG. 2). That is, the plurality of packages 12 is provided inside the frame-shaped lens holding member 13. A planar shape of the lens holding member 13 is, for example, a quadrangular shape. The lens holding member 13 has, for example, a holding part 131 having a quadrangular frame shape and a widened part 132 widened on the inside and the outside of the holding part 131. The widened part 132 is provided, for example, on two opposite sides of the quadrangular holding part 131. The lens holding member 13 may not necessarily be provided over the entire circumference of the base plate 11, and may be provided on three sides of the quadrangular base plate 11, for example. Alternatively, the lens holding member 13 may be provided on two opposite sides of the quadrangular base plate 11.

The lens holding member 13 is fixed to the base plate 11 using screws or the like (not illustrated), for example. A method of fixing the lens holding member 13 to the base plate 11 may be any method, and for example, an adhesive may be used to fix the lens holding member 13 to the base plate 11. The adhesive includes, for example, a resin material. Alternatively, the lens holding member 13 and the base plate 11 may be collectively molded using an insert molding process or the like.

A thickness of the holding part 131 (a size in the Z direction in FIG. 2) is greater than a thickness of the widened part 132, for example. The holding part 131 is in contact with the base plate 11 and the lens array 14. Thus, a distance between each package 12 and the corresponding lens 141 is adjusted by the thickness of the holding part 131. Here, the lens holding member 13 corresponds to a specific example of a distance adjustment member according to the present technology. The thickness of the holding part 131 is preferably large enough to maintain a space between the cover 125 and the lens array 14 and between the base plate 11 and the lens array 14 which is large enough to allow gas to flow. A gas flowable size is, for example, about 0.01 mm, which is a machining tolerance, or about 0.5 mm, which is a tolerance in resin molding. If the cover 125 and the lens array 14 are too close to each other, a desorbed matter caused by an adhesive or the like stays therebetween. The desorbed matter reacts with light and adsorbs on the cover 125 or the lens array 14, thereby deteriorates an optical property. The provision of the space having the gas flowable size between the cover 125 and the lens array 14 makes it possible to suppress such a decrease in the optical property. The holding part 131 has a thickness of, for example, about 1 mm to 30 mm. The thickness of the holding part 131 may be adjusted depending on, for example, a focal length of the lens 141 and an optical path length in the package 12. The holding part 131 includes, for example, a resin material.

The widened part 132 is provided with, for example, a terminal 132E. The terminal 132E is for electrically coupling, for example, the package 12 (the light-emitting element 121) to the outside through the wiring line 11W. A plurality of the terminals 132E is provided from the inside to the outside of the widened part 132. The terminal 132E includes a conductive metal material such as, for example, aluminum (Al) or the like. The widened part 132 of a portion other than the terminal 132E includes, for example, the same resin material as the resin material of the holding part 131. The widened part 132 and the holding part 131 may include different resin materials.

The lens holding member 13 including such a terminal 132E is formed, for example, by integral molding, and preferably includes one integrated component. This makes it possible to suppress the cost. In addition, forming the lens holding member 13 by integral molding makes it possible to reduce the cost. The lens holding member 13 may include a metal material such as aluminum (Al), SUS (Steel Use Stainless), iron (Fe), copper (Cu), or the like. Alternatively, the lens holding member 13 may include a ceramic material or the like. The shape of the lens holding member 13 may be formed by machining such as cutting, or may be formed by die casting, sintering, or the like.

(Lens Array 14)

The lens array 14 is opposed to the base plate 11 with the plurality of packages 12 interposed therebetween. The lens array 14 includes, for example, an array part 14A in a central portion and a frame part 14F surrounding the array part 14A. In the array part 14A, the plurality of lenses 141 is provided at positions opposing the respective packages 12. Each lens 141 is disposed, for example, at a position overlapping with the light-emitting element 121 and the mirror 123 in a plan view. The lens 141 includes, for example, a convex lens. The lens 141 may include a plano-convex lens, a biconvex lens, a meniscus lens, or the like. Light transmitted through the cover 125 of each package 12 is collimated by passing through the lens 141. The lens array 14 may have configurations that differ between a lower surface (e.g., a surface opposed to the base plate 11) side and a top surface side. For example, one surface side of the lens array 14 may have a FAC (Fast Axis Collimator) function, and the other surface side may have a SAC (Slow Axis Collimator) function. In the lens array 14 in this case, for example, flat surfaces of lenticular lenses disposed in directions perpendicular to each other are bonded.

The frame part 14F around the array part 14A has, for example, a quadrangular planar shape, and the frame part 14F is in contact with the holding part 131 of the lens holding member 13. The frame part 14F is fixed to the holding part 131 by, for example, an adhesive or the like (not illustrated). As the adhesive, a photocurable resin such as a UV (Ultra Violet) curable resin or the like may be used. Shrinkage of the resin by photocuring makes it easier to cause a positional deviation between the lens array 14 and the lens holding member 13. Thus, a resin material having a curing shrinkage amount of, for example, about several % or less is preferably used, and a resin material having a curing shrinkage amount of 1% or less is more preferably used. The lens array 14 may be fixed to the lens holding member 13 by screws or the like, for example. Alternatively, the lens array 14 and the lens holding member 13 may be collectively molded by an insert molding process or the like. As described above, a space having the gas flowable size is provided between the array part 14A and the base plate 11, and between the array part 14A and the package 12. The lens array 14 includes, for example, borosilicate glass or the like.

<Method of Manufacturing Light-Emitting Device 1>

First, the package 12 is formed. Specifically, after disposing the submount 122, the light-emitting element 121, and the mirror 123 on the recess 124R of the accommodation member 124, the cover 125 is bonded to the accommodation member 124 using, for example, soldering. As a result, the light-emitting element 121 and the like are hermetically sealed, and the package 12 is formed.

Next, each package 12 is mounted on the front surface 11A of the base plate 11. At this time, the electrode extraction part 12E of each package 12 is coupled to the wiring line 11W. A position of each package 12 may be determined, for example, by a marker provided on the base plate 11. Alternatively, the position may be determined by abutting the package 12 against a protrusion provided on the base plate 11. After the first package 12 has been disposed on the base plate 11, the subsequent package 12 may be disposed using, as the marker, an outer shape or a light emission point of the package 12 that has been disposed on the base plate 11. The heat radiation part 12R on the back surface of each package 12 may be sequentially bonded to the heat radiation part 11R of the base plate 11 with silver (Ag) paste, or all of the packages 12 may be disposed on the base plate 11 and then collectively cured with the silver paste. Collectively curing all of the packages 12 makes it possible to shorten a curing time.

Here, the submount 122 and the mirror 123 are sealed together with the light-emitting element 121 in each package 12; thus, the light emission point and a oscillation direction of each package 12 are determined at a time point prior to mounting the package 12 on the base plate 11. Therefore, by measuring an optical characteristic of each package 12 at this time point, it is possible to link each package 12 to the optical characteristic, and to suppress occurrence of variations between the packages 12 caused by individual differences and processing accuracies in the light-emitting elements 121. In addition, it becomes possible to calculate the positions of disposing the packages 12 from the optical characteristics of the respective packages 12 and to make an optical characteristic in a plane uniform.

After the plurality of packages 12 is arranged in a matrix on the front surface 11A of the base plate 11, the lens holding member 13 is fixed to the base plate 11 using, for example, screws. Next, for example, the wiring line 11W is coupled to the terminal 132E. Thereafter, the frame part 14F of the lens array 14 is fixed to the holding part 131 of the lens holding member 13 by using, for example, a resin material or the like. In this case, since it is only necessary to fix the arrangement of one component (the lens array 14) including the lenses 141 corresponding to the plurality of packages 12, it is possible to fix the arrangement in a shorter time as compared with a case where the lenses are disposed one by one in the respective packages 12. In addition, it is possible to enhance positional accuracy between each package 12 and the corresponding lens 141. For example, it is possible to complete the light-emitting device 1 in this manner.

<Operation of Light-Emitting Device 1>

In the light-emitting device 1, for example, light is extracted as follows. In each package 12 mounted on the base plate 11, light outputted from the light-emitting element 121 (e.g., light in the blue wavelength region) is reflected by the mirror 123 and transmits through the cover 125. The light transmitted through the cover 125 passes through a lens 141 at a position corresponding to each package 12, and becomes collimated light. Thus, traveling directions of the light beams passing through the respective lenses 141 are parallel to each other and are extracted from the light-emitting device 1.

<Workings and Effects of Light-Emitting Device 1>

In the light-emitting device 1, the light-emitting element 121 is provided in each of the plurality of packages 12. In other words, each light-emitting element 121 is sealed between the accommodation member 124 and the cover 125. As a result, it is possible to suppress occurrence of leakage as compared with the case where the plurality of light-emitting elements 121 is sealed collectively. Hereinafter, workings and effects thereof will be described.

In a case where the plurality of light-emitting elements is collectively sealed between one accommodation member and one cover, a volume of the accommodation member is increased, and a bonding region between the accommodation member and the cover is also increased. A stress is concentrated on the large bonding region, and a crack and leakage in the accommodation member, the cover, and the like may occur.

Further, in a case where the leakage occurs, all of the plurality of light-emitting elements sealed in the accommodation member is discarded; hence, a yield greatly influences the cost.

In contrast, in the present embodiment, each light-emitting element 121 is sealed between the accommodation member 124 and the cover 125; thus, it is not necessary to increase the volume of the accommodation member 124. Accordingly, it is possible to reduce the bonding region between the accommodation member 124 and the cover 125.

Therefore, it is possible to suppress the occurrence of the cracks and the leakage in the accommodation member 124, the cover 125, and the like caused by the concentration of the stress on the bonding region.

Further, if the leakage occurs in one package 12, it is only necessary to discard one light-emitting element 121, which makes it possible to suppress the influence of the discarded member on the cost.

Still further, since the plurality of packages 12 is disposed on the base plate 11, if a defect occurs in one package 12, it is possible to perform replacing of only this package 12. Therefore, repair is easier than in the case where the plurality of light-emitting elements is sealed collectively.

In addition, since the each light-emitting element 121 is sealed to the package 12, an amount of gas present in each package 12 (between the accommodation member 124 and the cover 125) is small as compared to the case where the plurality of light-emitting elements is sealed collectively. Therefore, it is possible to suppress reliability degradation caused by noxious gas present in each package 12. The noxious gas is, for example, moisture or the like.

As described above, in the present embodiment, since each light-emitting element 121 is sealed between the accommodation member 124 and the cover 125, it is possible to suppress the occurrence of leakage as compared with the case where the plurality of light-emitting elements is sealed collectively. Therefore, it is possible to suppress the occurrence of leakage.

Further, the lens holding member 13, more specifically, the holding part 131, is provided between the base plate 11 on which the plurality of packages 12 is disposed placed and the lens array 14; therefore, it is possible to adjust the distance between each package 12 and the corresponding lens 141 to a desired size.

Moreover, the submount 122 and the mirror 123 are sealed together with the light-emitting element 121 in one package 12; therefore, it is possible to determine the light emission point and the oscillation direction of each package 12 prior to mounting the package 12 on the base plate 11. If the light-emitting element 121 and the mirror 123 are separately mounted on the base plate 11, variations tend to occur in the respective mounting positions, and it is difficult to enhance the positional accuracy. In contrast, in the light-emitting device 1, the submount 122 and the mirror 123 are sealed together with the light-emitting element 121 in one package 12; therefore, it is possible to enhance the positional accuracy at the time of mounting the plurality of packages 12 on the base plate 11.

Hereinafter, modification examples of the first embodiment and other embodiments will be described; however, in the following description, the same components as those of the first embodiment will be denoted by the same reference numerals, and description thereof will be omitted as appropriate.

Modification Example 1

The plurality of packages 12 (the light-emitting elements 121) mounted on the base plate 11 may output the respective light beams in different wavelength regions. The plurality of packages 12 mounted on the base plate 11 may include, for example, a package 12 including a light-emitting element 121 that outputs light in the red wavelength region, a package 12 including a light-emitting element 121 that outputs light in the blue wavelength region, and a package 12 including a light-emitting element 121 that outputs light in the green wavelength region. A ratio and an arrangement of the packages 12 of the respective colors are adjusted on the basis of a luminosity curve and an output (mW, lm). As a result, it is possible to extract white light from the light-emitting device 1. In this case, for example, the light-emitting device 1 has a diffuser panel or the like, and the light outputted from the package 12 passes through the lens 141 and the diffuser panel or the like.

In this manner, it is possible to easily mount, on the base plate 11, the packages 12 (the light-emitting elements 121) that output light beams in the wavelength regions different from each other in a desired ratio and in a desired arrangement. Therefore, it is possible to easily adjust an entire optical balance.

The light-emitting element 121 may include an LED (Light Emitting Diode) or the like; however, in the light-emitting element 121 including a semiconductor laser element, it is possible to increase the light intensity and to recognize the light at a more distant position as compared with the case where the light-emitting element 121 includes the LED.

Modification Example 2

Although the case where the electrode extraction part 12E from the light-emitting element 121 is provided on the back surface of the package 12 has been described in the first embodiment, the electrode extraction part 12E may be provided at a place other than the back surface of the package 12.

FIG. 8 illustrates an exemplary planar configuration of the package 12 having the electrode extraction part 12E on a top surface. Two electrode extraction parts 12E are provided on the top surface of the package 12 exposed from the cover 125.

FIG. 9 illustrates the package 12 illustrated in FIG. 8 together with the terminal 132E of the lens holding member 13. For example, one electrode of the light-emitting element 121 is electrically coupled to one electrode extraction part 12E, through the wire W, for example, and the other electrode of the light-emitting element 121 is electrically coupled to the other electrode extraction part 12E through the conductive submount 122. The electrode extraction parts 12E provided on the top surface of the respective packages 12 are coupled to each other through, for example, wires (wires WA). The electrode extraction part 12E of the package 12 located closest to the terminal 132E of the lens holding member 13 is coupled to the terminal 132E through the wire WA. This makes it possible to couple the outside and the light-emitting element 121 of the package 12.

In the case where the electrode extraction part 12E is provided on the top surface, the heat radiation parts 12R of the back surfaces of the packages 12 that are adjacent to each other (or the heat radiation part 11R of the base plate 11) may be continuous through the silver paste. By thermally coupling the heat radiation parts 12R of the packages 12 that are adjacent to each other in a similar manner as described in the first embodiment, the heat dissipation path is spread, and it is possible to improve a heat dissipation property.

In this way, the package 12 having the electrode extraction part 12E on the top surface is able to make the heat radiation part 12R on the back surface of the package 12 (FIG. 4 and FIG. 6) larger. Therefore, it is possible to enhance heat dissipation and adhesive strength as compared with the package 12 having the electrode extraction part 12E on the back surface.

Second Embodiment

FIG. 10 is a schematic exploded perspective view of a main part of a light-emitting device (a light-emitting device 2) according to a second embodiment of the present disclosure. The light-emitting device 2 includes the base plate 11, the package 12, and the lens array 14 in this order. That is, the light-emitting device 2 is not provided with a lens holding member (e.g., the lens holding member 13 in FIG. 2). The base plate 11 of the light-emitting device 2 includes, for example, a plate part 111, a holding part 112, and a terminal 113E. Except for this point, the light-emitting device 2 according to the second embodiment has a similar configuration as the light-emitting device 1 according to the first embodiment, and has similar workings and effects.

The plate part 111 of the base plate 11 is, for example, a plate-shape member having a quadrangular planar shape. The plurality of packages 12 is arrange on the plate part 111 in a matrix, for example.

The holding part 112 has a quadrangular frame-shaped planar shape surrounding the plurality of packages 12 arranged in a central portion of the plate part 111. The holding part 112 is in contact with the plate part 111 and the lens array 14 (the frame part 14F), and a distance between each package 12 and the corresponding lens 141 is adjusted by a thickness of the holding part 112. Here, the holding part 112 of the base plate 11 corresponds to a specific example of a "distance adjustment member" of the present technology.

The terminal 113E, for example, has a strip-shaped planar shape extending in one direction (the Y direction in FIG. 10), and is provided on the plate part 111. The terminal 113E extends from an inner side to an outer side of the holding part 112. The electrode extraction part 12E of the package 12 (FIG. 4 and FIG. 6) is electrically coupled to the terminal 113E, thereby electrically coupling the light-emitting element 121 to the outside.

The plate part 111, the holding part 112, and the terminal 113E are, for example, integrated. The plate part 111 includes, for example, aluminum, the holding part 112 includes, for example, PEEK (polyether ether ketone), and the terminal 113E includes a metal material. The plate part 111 and the holding part 112 are collectively molded by, for example, insert-injection molding or the like. The plate part 111 may include, for example, copper (Cu), copper tungsten (Cu—W), aluminum nitride (AlN), or the like, and the holding part 112 may include, for example, alumina, aluminum nitride, Kovar, or the like. In this case, the plate part 111 and the holding part 112 are insulated from the terminal 113E by, for example, low-melting glass or the like.

As described above, instead of the lens holding member 13, another member (e.g., the base plate 11) may be provided with a function of adjusting the distance between the package 12 and the lens 141.

Application Example

The light-emitting devices 1 and 2 described in the first embodiment and the second embodiment are applicable to, for example, a projection display apparatus.

FIG. 11 is a diagram illustrating an exemplary configuration of a projection display apparatus (a projection display apparatus 200) to which the light-emitting device 1 or 2 is applied as a light source. The projection display apparatus 200 is, for example, a display device that projects an image on a screen. The projection display apparatus 200 is coupled to an external image supplying device such as a computer such as a PC or various image players through an I/F (interface), and performs projection on a the screen or the like on the basis of image signals inputted to the I/F. It is to be noted that the configuration of the projection display apparatus 200 described below is an example, and the projection display apparatus according to the present technology is not limited to such a configuration.

The projection display apparatus 200 includes the light-emitting device 1 or 2, a multi-lens array 212, a PbS array 213, a focus lens 214, mirrors 215, dichroic mirrors 216 and 217, light modulators 218a to 218c, a dichroic prism 219, and a projection lens 220.

In the light-emitting device 1 or 2, the light outputted from the light-emitting element 121 passes through the lens array 14 and is extracted as collimated light. The light enters the multi-lens array 212. The multi-lens array 212 has a structure in which a plurality of lens elements arranged in an array, and condenses the light outputted from the light-emitting device 1 or 2. The PbS array 213 polarizes the light condensed by the multi-lens array 212 to light of a predetermined polarization direction, for example, a P-polarized wave. The focus lens 214 condenses the light that has been converted by the PbS array 213 into the light of the predetermined polarization direction.

Of the light that has entered through the focus lens 214 and the mirror 215, the dichroic mirror 216 transmits red light R and reflects green light G and blue light B. The red light R transmitted through the dichroic mirror 216 is led to the light modulator 218a through the mirror 215.

Of the light reflected by the dichroic mirror 216, the dichroic mirror 217 transmits the blue light B and reflects the green light G. The green light G reflected by the dichroic mirror 217 is led to the light modulator 218b. On the other hand, the blue light B transmitted through the dichroic mirror 217 is led to the light modulator 218c through the mirror 215.

The light modulators 218a to 218c optically modulate the respective inputted color light beams, and input the optically modulated color light beams to the dichroic prism 219. The dichroic prism 219 combines color light beams that have been optically modulated and inputted into one optical axis. The combined color light beams are projected onto a screen or the like through the projection lens 220.

In the projection display apparatus 200, three light modulators 218a to 218c corresponding to three primary colors of red, green, and blue are combined, and all colors are displayed. That is, the projection display apparatus 200 is a so-called three-plate projection display apparatus.

Although the present technology has been described with reference to the embodiments and modification examples, the present technology is not limited to the embodiments and the like described above, and various modifications can be made. For example, the components, the arrangement, the number, and the like of the light-emitting devices 1 and 2 described in the above embodiments are merely examples, and the light-emitting devices 1 and 2 do not necessarily include all the components, and may further include other components.

Further, the cases have been described in which the light-emitting devices 1 and 2 are each provided with the terminal 132E or 113E for electrically coupling the light-emitting element 121 to the outside in the lens holding member 13 or the base plate 11; however, the terminal may be provided separately from the lens holding member 13 or the base plate 11.

Further, in the above embodiments and the like, the cases have been described in which the holding part 112 of the lens holding member 13 or the base plate 11 functions as the distance adjustment member; however, the distance adjustment member may be provided separately from the lens holding member 13 and the base plate 11.

In addition, in the above embodiments and the like, the cases have been described in which the sealed space is formed by the accommodation member 124 having the recess 124R and the flat plate-shaped cover 125; however, the sealed space for accommodating the light-emitting element 121 and the like may be formed by the flat plate-shaped accommodation member 124 and the cover 125 having a recess.

It is to be noted that the effects described herein are mere examples, are not limited to those described herein, and may include any effects other than those described herein.

It is to be noted that the present technology may have the following configurations.

(1)
A light-emitting device including:
a package including a light-emitting element, a reflection member that reflects light outputted from the light-emitting element, and a sealed space that accommodates the light-emitting element and the reflection member;
a base plate on which a plurality of the packages is mounted; and
lenses opposed to the base plate with the plurality of packages interposed therebetween, the lenses being opposed to the respective packages.

(2)
The light-emitting device according to (1), in which the lenses are included in a lens array.

(3)
The light-emitting device according to (2), in which a gap is provided between the base plate and the lens array.

(4)
The light-emitting device according to any one of (1) to (3), further including
a distance adjustment member that adjusts a distance between the package and the lens to a predetermined size.

(5)
The light-emitting device according to (4), in which the distance adjustment member has a shape of a frame, and the plurality of packages is disposed inside the frame.

(6)
The light-emitting device according to (4) or (5), in which the distance adjustment member includes a terminal that electrically couples the light-emitting element to an outside.

(7)
The light-emitting device according to any one of (4) to (6), in which the distance adjustment member is integrated.

(8)
The light-emitting device according to any one of (4) to (6), in which the distance adjustment member is integrated with the base plate.

(9)
The light-emitting device according to any one of (1) to (8), in which the light-emitting element includes a semiconductor laser.

(10)
The light-emitting device according to (9), in which the semiconductor laser includes a gallium nitride (GaN)-based semiconductor.

(11)
The light-emitting device according to any one of (1) to (10), in which
the package further includes a first accommodation member provided with a recess and a second accommodation member that seals the recess, and
the sealed space is formed by the first accommodation member and the second accommodation member.

(12)
The light-emitting device according to (11), in which
the first accommodation member and the second accommodation member are provided in this order from a side of the base plate, and
the package further includes a submount, the submount being provided between the light-emitting element and the first accommodation member.

(13)
The light-emitting device according to (12), in which the submount is conductive.

(14)
The light-emitting device according to any one of (11) to (13), in which
the first accommodation member and the second accommodation member are provided in this order from a side of the base plate, and
an electrode extraction part is provided on a bonding surface of the first accommodation member with the base plate, the electrode extraction part being electrically coupled to an electrode of the light-emitting element.

(15)
The light-emitting device according to any one of (11) to (13), in which
the first accommodation member and the second accommodation member are provided in this order from a side of the base plate, and
an electrode extraction part is provided on a top surface of the first accommodation member, the top surface being exposed from the second accommodation member, the electrode extraction part being electrically coupled to an electrode of the light-emitting element.

(16)
The light-emitting device according to any one of (11) to (15), including the light-emitting elements that output light beams having wavelengths different from each other.

(17)
The light-emitting device according to any one of (11) to (16), in which the reflection member includes a mirror.

(18)
The light-emitting device according to any one of (11) to (17), further including
a heat conductive member between the package and the base plate, in which
the packages that are adjacent to each other are coupled to each other through the heat conductive member.

(19)
A projection display apparatus including
a light-emitting device, the light-emitting device including:
a package including a light-emitting element, a reflection member that reflects light outputted from the light-emitting element, and a sealed space that accommodates the light-emitting element and the reflection member;
a base plate on which a plurality of the packages is mounted; and
lenses opposed to the base plate with the plurality of packages interposed therebetween, the lenses being opposed to the respective packages.

This application claims the benefit of Japanese Priority Patent Application JP2018-152939 filed with the Japan Patent Office on Aug. 15, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A light-emitting device comprising:
a package including an accommodation member in which a light-emitting element and a reflection member that reflects light outputted from the light-emitting element are disposed, and a cover having a transparent portion and a metallic bonding portion joined to a corresponding bonding portion of the accommodation member, forming a sealed space that accommodates the light-emitting element and the reflection member;
a base plate on which a plurality of the packages is mounted; and
lenses opposed to the base plate with the plurality of packages interposed therebetween, the lenses being opposed to the respective packages.

2. The light-emitting device according to claim 1, wherein the lenses are included in a lens array.

3. The light-emitting device according to claim 2, wherein a gap is provided between the base plate and the lens array.

4. The light-emitting device according to claim 2, further comprising
a distance adjustment member that adjusts a distance between the package and the lens to a predetermined size.

5. The light-emitting device according to claim 4, wherein the distance adjustment member has a shape of a frame, and the plurality of packages is disposed inside the frame.

6. The light-emitting device according to claim 4, wherein the distance adjustment member includes a terminal that electrically couples the light-emitting element to an outside.

7. The light-emitting device according to claim 4, wherein the distance adjustment member is integrated.

8. The light-emitting device according to claim 4, wherein the distance adjustment member is integrated with the base plate.

9. The light-emitting device according to claim 1, wherein the light-emitting element includes a semiconductor laser.

10. The light-emitting device according to claim 9, wherein the semiconductor laser includes a gallium nitride (GaN)-based semiconductor.

11. The light-emitting device according to claim 1, wherein
the package further includes a first accommodation member provided with a recess and a second accommodation member that seals the recess, and
the sealed space is formed by the first accommodation member and the second accommodation member.

12. The light-emitting device according to claim 11, wherein
the first accommodation member and the second accommodation member are provided in this order from a side of the base plate, and
the package further includes a submount, the submount being provided between the light-emitting element and the first accommodation member.

13. The light-emitting device according to claim 12, wherein the submount is conductive.

14. The light-emitting device according to claim 11, wherein
the first accommodation member and the second accommodation member are provided in this order from a side of the base plate, and
an electrode extraction part is provided on a bonding surface of the first accommodation member with the base plate, the electrode extraction part being electrically coupled to an electrode of the light-emitting element.

15. The light-emitting device according to claim 11, wherein
the first accommodation member and the second accommodation member are provided in this order from a side of the base plate, and
an electrode extraction part is provided on a top surface of the first accommodation member, the top surface being exposed from the second accommodation member, the electrode extraction part being electrically coupled to an electrode of the light-emitting element.

16. The light-emitting device according to claim 1, comprising the light-emitting elements that output light beams having wavelengths different from each other.

17. The light-emitting device according to claim 1, wherein the reflection member includes a mirror.

18. The light-emitting device according to claim 1, further comprising
a heat conductive member between the package and the base plate, wherein
the packages that are adjacent to each other are coupled to each other through the heat conductive member.

19. A projection display apparatus comprising
a light-emitting device, the light-emitting device including:
a package including an accommodation member in which a light-emitting element, a reflection member that reflects light outputted from the light-emitting element are disposed, and a cover having a transparent portion and a metallic bonding portion joined to a corresponding bonding portion of the accommodation member, forming sealed space that accommodates the light-emitting element and the reflection member;
a base plate on which a plurality of the packages is mounted; and
lenses opposed to the base plate with the plurality of packages interposed therebetween, the lenses being opposed to the respective packages.

* * * * *